United States Patent [19]

Diamond

[11] 4,369,344

[45] Jan. 18, 1983

[54] SENSITIVE DOOR EDGE WIEGAND MODULE SWITCH ASSEMBLY

[75] Inventor: John A. Diamond, Glenview, Ill.

[73] Assignee: Vapor Corporation, Chicago, Ill.

[21] Appl. No.: 60,925

[22] Filed: Jul. 26, 1979

[51] Int. Cl.³ .................. H01H 3/16; H01F 7/00; E05F 15/02; G11C 11/00
[52] U.S. Cl. .................... 200/61.43; 49/27; 335/215; 335/219; 365/133
[58] Field of Search .............. 200/61.43, 86 R, ; 49/27, 28; 335/205, 206, 207, 215, 303, 306; 338/32 R, 32 H, 42; 73/DIG. 2, 722, 728; 336/110; 365/62, 86, 133, 137

[56] References Cited

U.S. PATENT DOCUMENTS

| 2,476,111 | 7/1949 | Opalek ................................. 49/27 |
| 2,493,157 | 1/1950 | Merralls et al. ................ 200/86 R |
| 3,303,303 | 2/1967 | Miller ............................. 200/61.43 |
| 3,622,926 | 11/1971 | Risk ................................ 335/303 X |
| 3,710,050 | 1/1973 | Richards ........................... 49/28 X |
| 3,820,090 | 6/1974 | Wiegand ........................... 365/133 |
| 3,866,193 | 2/1975 | Wiegand ........................... 365/133 |
| 4,133,365 | 1/1979 | Schleicher .................. 200/61.43 X |
| 4,199,741 | 4/1980 | Paulet ............................... 335/206 |

OTHER PUBLICATIONS

Tapeswitch Corporation of America; Industrial User Catalog C-4; Farmingdale, N.Y.; Date: 12-31-70, 6 pp.
Wigen; Philip E.; "Wiegand Wire: New Material for Magnetic-based Devices", Electronics; Jul. 10, 1975; pp. 100-105.
IBM Tech. Disc. Bull.; R. L. Hollis, Jr.; "Additive Pulses from a Bundle of Internally Stressed Magnetostrictive Wires"; vol. 21, No. 10, Mar. 1979; pp. 4266, 4267.
Canadian Controls & Instrumentation; "Wiegand Pulses Breakthrough Into New Applications", Dec. 1977, pp. 16-19.

Primary Examiner—J. R. Scott
Attorney, Agent, or Firm—Francis J. Lidd

[57] ABSTRACT

A sensitive edge 10 for door systems, lifts, doors, or other moving portions of transit vehicles that come into contact with articles or passengers includes a body defining a resilient deformable leading edge portion 30 and a base portion 32 within which is defined an internal chamber. A coupling portion is defined on and extending from the base for coupling the sensitive edge to the door or similar device 36. The chamber 34 is hollow and at atmospheric pressure and in the preferred embodiment, is filled with air. Within the chamber is mounted a Wiegand wire and pick-up coil 38 that is electrically coupled to a switch for recycling the door or similar device upon engagement of the sensitive edge with an object such as a passenger. Also mounted within the chamber and spaced from the Wiegand wire or pick-up coil and wire is a magnet or similar magnetic field creating device 40 such that upon deformation of the sensitive edge, the magnet and Wiegand wire are brought sufficiently close together to cause a switching function to open the door or similar device.

8 Claims, 3 Drawing Figures

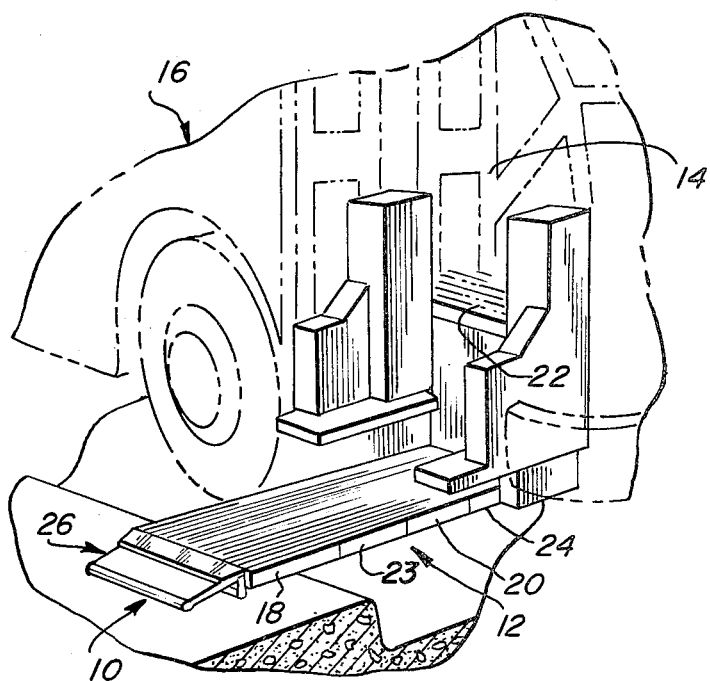
FIG. 1
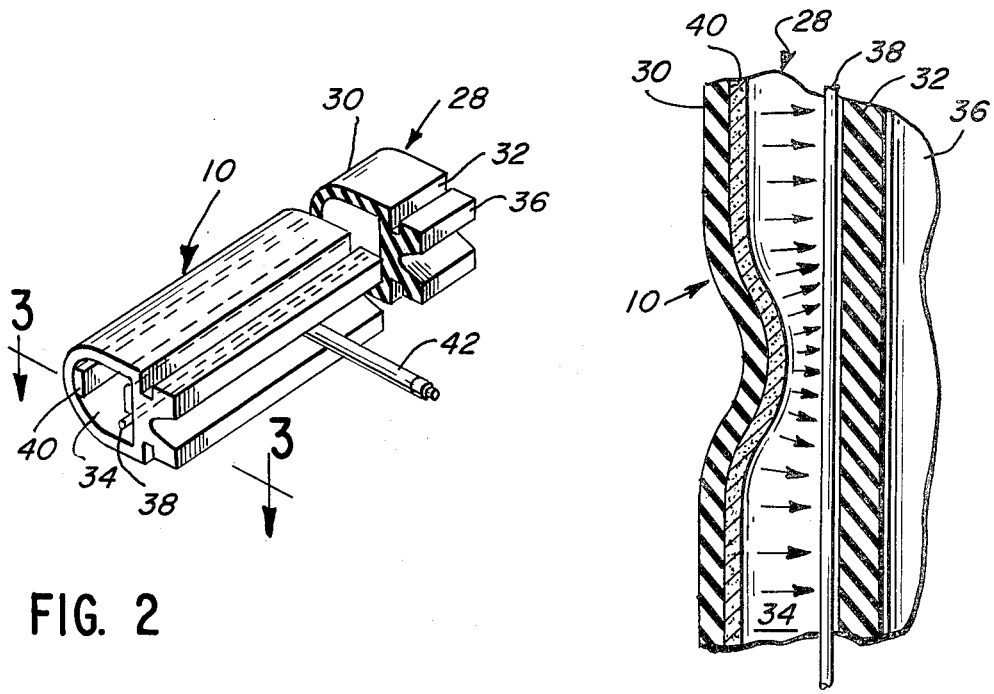
FIG. 2
FIG. 3

SENSITIVE DOOR EDGE WIEGAND MODULE SWITCH ASSEMBLY

BACKGROUND OF THE INVENTION

A. Field of the Invention

The present invention relates to improvements in sensitive edges employed on doors or similar devices in transit vehicles.

B. Description of the Prior Art

Increased emphasis on safety for transit vehicles has imposed stringent requirements on door systems, lifts, high/low platforms and transit car treadles and particularly in the area of the sensitive edges employed on these devices to sense passengers or objects trapped or engaged by the doors, lifts, and treadles. The most direct means of sensing objects is through the use of sensitive door edges, but historically sensitive edges have been complex in design and somewhat critical in application requiring a high rate of repair along with high maintenance requirements.

Three prior art types of sensitive edges are mechanical such as the type illustrated in U.S. Pat. No. 2,476,111; electrical as illustrated in U.S. Pat. No. 2,493,157 and pneumatic as illustrated in U.S. Pat. No. 3,303,303. These prior art systems, however, are often sensitive to temperature variation, debris carried by the environment and wear over long periods of use thereby reducing their utility.

SUMMARY OF THE INVENTION

An object of the present invention is to provide an improved sensitive edge employed in door systems or the like in transit vehicles.

Another object of the present invention is to provide a new and improved sensitive edge that does not employ electrical contacts or mechanical elements.

The present invention is directed to an improved sensitive edge for doors, lifts, high/low platforms, car treadles and similar apparatus on transit vehicles. The improved sensitive edge of the present invention includes a body defining a resilient deformable leading edge portion and a base within which is defined an internal chamber. The base includes a connecting portion for connecting the sensitive edge to the door or similar device. Mounted within the chamber is a Wiegand wire or sensing wire and pick-up coil spaced from which is also mounted a device for creating a magnetic field. Upon engagement of the sensing edge by a person or article, the body is deformed moving the wire and magnetic device closer together creating a pulse that is directed to a switch to recycle the door or similar device out of engagement with the person or article.

BRIEF DESCRIPTION OF THE DRAWING

The above and other objects and advantages and novel features of the present invention will become apparent from the following detailed description of the preferred embodiment of the invention illustrated in the accompanying drawing wherein:

FIG. 1 is a view illustrating the sensitive edge of the present invention employed on a lift of a transit vehicle;

FIG. 2 is a perspective view of the device of the present invention; and,

FIG. 3 is a view taken along line 3—3 of FIG. 2.

DETAILED DESCRIPTION OF THE PREFERRED EMBODIMENT

Referring now to the drawings; the present invention relates to an improved sensitive edge generally designated by the reference numeral 10 that may be employed on various components of transit vehicles, on elevator doors and similar devices for sensing an individual or an obstruction. One example of the many uses for the sensitive edge 10 of the present invention is on a lift of the type employed to load a wheel chair or similar vehicle onto a transit vehicle. Such a lift is illustrated in FIG. 1 and designated by the reference numeral 12. Since the lift 12 is only one type of use of the present invention, it will only be generally described.

The lift 12 may be mounted within a door way access 14 of a transit vehicle shown in phantom lines and generally designated by the reference numeral 16. The lift assembly 12 in FIG. 1 is illustrated in an extended position and includes first 18 and second 20 steps that closed position of the lift 12 may be used to walk up to the floor level 22 of the transit vehicle 16. Steps 18 and 20 are joined by pivoted risers 23 and 24 so that once the lift assembly 12 is extended to the lift configuration, a platform defined by the steps 18 and 20 and the risers 23 and 24 is provided.

A gate assembly generally designated by the reference numeral 26 is provided at the end of the lift 12. In addition, the gate 26 serves the function of sensing an obstruction such as a curb or a passenger during the extension of the lift 12 into the platform configuration. This sensing function is provided by the improved sensing edge 10. For example, upon extension of the platform 12, if a curb is engaged by the sensitive edge 10, further extension of the lift 12 will be terminated and the lift withdrawn to prevent damage.

The improved sensitive edge 10 of the present invention as best illustrated in FIGS. 2 and 3 is defined by a resilient deformable body generally designated by the reference numeral 28 that in the preferred embodiment is fabricated of an elastomeric material. The body 28 defines a leading edge or edge portion 30 and a base portion 32. The base 32 and edge 30 portions define an internal hollow chamber 34 that may be filled with fluid at ambient pressure and in the preferred embodiment is filled with air. In order that the improved sensitive edge 10 may be coupled to a door or similar device, a coupling portion 36 is defined on and extends from the base 32 and is of a configuration to allow it to be inserted into a recess defined in the gate 26 of the lift 12.

Since the improved sensitive edge 10 is fabricated from a resilient deformable elastomeric material, the leading edge portion 30 will be deformed upon engagement with an object or a person and this deformation is employed to actuate a switch to recycle the door or lift upon which the improved sensitive edge 10 is employed to prevent damage or harm to the object or individual engaged by the leading edge portion 30. More specifically, as best illustrated in FIG. 3, the improved sensitive edge 10 includes a Wiegand wire and coil, or module 38 or plurality of modules distributed along the edge, within the chamber 34 that is secured to the base portion 32. On the opposite side of the chamber 34 spaced from the Wiegand wire module 38 is a continuous flexible magnet 40 mounted to the leading edge portion 30. In an alternative embodiment, the continuous flexible magnet 40 may be a segmented magnet. The Wiegand wire module 38 is electrically connected to lines 42 that are connected to a switch (not shown) that will stop motion of the lift or recycle the door in response to a signal transmitted by the module 38.

The operation of the improved sensitive edge 10 is as follows. Upon engagement of the sensitive edge 10 with an object or person, the leading edge portion 30 is deformed. This deformation moves the magnet 40 toward the Wiegand wire module 38 and the change or increased flux created by this increased proximity of the magnet 40 to the Wiegand wire 38 causes the Wiegand wire 38 to switch producing a signal or pulse that is transmitted through the lead lines 42 to the switch that controls the cycling of the door or lift or other device causing a recycling to avoid damage or harm to the object or person.

The improved sensitive edge 10 of the present invention as opposed to the typical prior art sensitive edges is not influenced by environmental conditions or variances in pressure within the chamber 34 since air pressure is not a factor and there are no electrical contacts or similar elements that are adversely affected by such conditions. Also, very slow changes in internal edge pressure occasioned by low speed contact with the edge result in positive indication of obstruction. Prior art edges require substantial deformation to signal. In addition, since only a portion of the magnet 40 need to be moved toward the Wiegand module 38 to accomplish the switching, the improved sensitive edge 10 will operate even though it is fragmented, cut up or worn out in places.

An additional mode of sensitive edge operation is provided by the opposite polarity pulses generated by the Wiegand module. Movement of the magnet 40 toward and away from the module 38 generate current pulses of opposite polarity. Electronic sensing devices therefore signal either contact with or withdrawal of an obstruction encountered by the edge. Detection of obstruction withdrawal provides means for greatly reducing nuisance stops of transit cars utilizing sensitive edges in automatically closed doors.

Many modifications and variations of the present invention are possible in light of the above teachings. Thus it is to be understood that, within the scope of the appended claims, the invention may be practiced other than as specifically described above.

What is claimed and desired to be secured by Letters Patent of the United States is:

1. Improved sensitive edge for detecting obstructions in the path of a power door, comprising a resilient deformable body defining an internal hollow chamber;

signal means generating an electrical current pulse in response to encountering a magnetic field of predetermined intensity in said chamber continuously disposed internal of said edge; and, means for generating a magnetic field of said predetermined intensity movably mounted in said chamber spaced from and contiguous said signal means;

wherein deformation of said edge at any point moves said magnetic field into close proximity to said signal means thereby generating said current pulse.

2. The sensitive edge set forth in claim 1 wherein said signal means comprises a wire and a pick-up coil.

3. The sensitive edge set forth in claim 1 wherein said means for creating a magnetic field comprises a flexible magnet.

4. The sensitive edge set forth in claim 1 wherein said means for creating a magnetic field comprises a segmented magnet.

5. The sensitive edge set forth in claim 1 wherein said body includes a base and a deformable edge portion, said signal means mounted on said base and said means for creating a magnetic field mounted on said edge portion.

6. An improved sensitive edge for a transit vehicle door or the like comprising;

a resilient, deformable body;

said body defining a leading edge, a base, and a connecting portion for connecting said body to said door or the like;

said body further defining a hollow internal chamber;

a distributed wiegand module secured to said base in said chamber for generating a current pulse in the presence of a magnetic field; and a distributed magnet secured in said chamber to said leading edge, and spaced from said wiegand module.

7. The sensitive edge claimed in claim 6 wherein said magnet comprises a flexible magnet.

8. The sensitive edge claimed in claim 6 wherein said magnet comprises a segmented magnet.

* * * * *